(12) United States Patent
Lerner

(10) Patent No.: US 8,053,897 B2
(45) Date of Patent: Nov. 8, 2011

(54) PRODUCTION OF A CARRIER WAFER CONTACT IN TRENCH INSULATED INTEGRATED SOI CIRCUITS HAVING HIGH-VOLTAGE COMPONENTS

(75) Inventor: Ralf Lerner, Erfurt (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 717 days.

(21) Appl. No.: 11/908,269

(22) PCT Filed: Mar. 10, 2006

(86) PCT No.: PCT/DE2006/000429
§ 371 (c)(1),
(2), (4) Date: Jul. 24, 2008

(87) PCT Pub. No.: WO2006/094495
PCT Pub. Date: Sep. 14, 2006

(65) Prior Publication Data
US 2008/0283960 A1    Nov. 20, 2008

(30) Foreign Application Priority Data
Mar. 10, 2005  (DE) .......................... 10 2005 010 944

(51) Int. Cl.
*H01L 29/40* (2006.01)
(52) U.S. Cl. ........ 257/773; 257/350; 257/506; 438/424; 438/675
(58) Field of Classification Search ............ 438/598, 438/595, 596, 620, 669–673, 424, 674, 675; 257/773, 350, 506
See application file for complete search history.

(56) References Cited

U.S. PATENT DOCUMENTS
4,256,514 A   3/1981   Pogge
(Continued)

FOREIGN PATENT DOCUMENTS
DE    37 15 232    11/1988

OTHER PUBLICATIONS

Quirk, Michael, and Julian Serda. Semiconductor Manufacturing Technology. p. 208-209. Upper Saddle River, NJ: Prentice Hall, 2001. Print.*

(Continued)

*Primary Examiner* — Kiesha Bryant
*Assistant Examiner* — Mark Tornow
(74) *Attorney, Agent, or Firm* — Hunton & Williams, LLP

(57) ABSTRACT

The invention relates to a method for producing structures which make it possible to form a trench insulation and to bring into contact SOI wafers provided with active thick layers and which are easily processable. For this purpose, a carrier wafer electric contact and the insulation trench are provided with components exhibiting high-blocking capability of insertion into an integrated circuit SOI wafer. A narrow trench for an insulating trench (8) and a large trench for a carrier wafer contact (9) are etched up to an insulating oxide layer (2) and are buried by a masking layer which is thicker than the buried oxide layer (2). In the large trench (9), a polysilicon spacer (12) remains on the sidewalls, respectively, in the form of a predeposited polysilicon layer (11) rest. The adjustment of the polysilicon etching makes it possible to obtain the spacer (12) provided with a desired height. At least buried oxide (2, 10) is removed by etching from the bottom of the large trench (9) in such a way that a residual oxide layer (13) remains on the surface. The deposition of a second electrically conductive filling layer (14) fills also a large insulating trench (19).

18 Claims, 5 Drawing Sheets

U.S. PATENT DOCUMENTS

Figure 1:
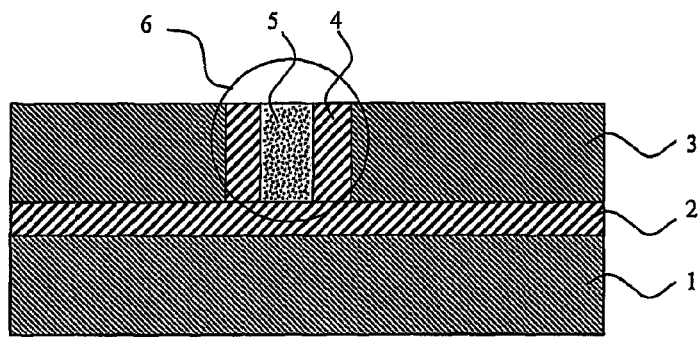

| | | | |
|---|---|---|---|
| 5,236,863 A * | 8/1993 | Iranmanesh | 438/429 |
| 5,314,841 A | 5/1994 | Brady et al. | |
| 5,445,988 A * | 8/1995 | Schwalke | 438/432 |
| 5,479,048 A * | 12/1995 | Yallup et al. | 257/621 |
| 5,569,621 A | 10/1996 | Yallup et al. | |
| 5,854,120 A * | 12/1998 | Urano et al. | 438/404 |
| 5,945,712 A | 8/1999 | Kim | |
| 6,294,451 B1 * | 9/2001 | Yoshizawa | 438/597 |
| 6,300,666 B1 | 10/2001 | Fechner et al. | |
| 6,521,947 B1 | 2/2003 | Ajmera et al. | |
| 6,611,024 B2 * | 8/2003 | Ang et al. | 257/350 |
| 6,649,964 B2 | 11/2003 | Kim | |
| 6,653,221 B1 * | 11/2003 | Subramanian et al. | 438/620 |
| 6,794,716 B2 | 9/2004 | Park et al. | |
| 2007/0262411 A1 * | 11/2007 | Rauscher | 257/506 |

OTHER PUBLICATIONS

"Simultaneous Formation of Glass and Silicon Trenches," IBM Technical Disclosure Bullentin, IBM Corp., New York, vol. 33, No. 3A, Aug. 1990, pp. 118-120.

Wang, "Selective Substrate Contact with Dual Width Trenches," Motorola Technical Developments, Motorola, Inc., Schaumburg, IL, vol. 18, No. 1, Mar. 1993, pp. 18-21.

* cited by examiner

PRODUCTION OF A CARRIER WAFER CONTACT IN TRENCH INSULATED INTEGRATED SOI CIRCUITS HAVING HIGH-VOLTAGE COMPONENTS

The invention relates to a method for concurrently manufacturing carrier substrate contacts and isolation trenches of integrated circuits including high voltage devices for thick active silicon layers having a thickness of 50 µm or higher on the basis of SOI technology and the corresponding trench patterning.

In SOI wafers a problem arises in that the carrier substrate ("handle wafer") is electrically insulated. In order to apply a fixed potential to this carrier substrate an electric contact is desirable. This may sometimes be accomplished from the rear side of the wafer. It may also be necessary or advantageous to realise the contact via the front side. This contact connecting to the carrier wafer enables the application of a defined electrical potential to the carrier substrate.

Without such a contact the carrier wafer is "floating", that is, the carrier wafer may have a varying electrical potential, thereby possibly adversely affecting the electrical functions of the integrated circuit on the top side of the active wafer ("floating body effect").

In order to be able to take advantage of the dielectric isolation of the SOI wafer, in particular for integrated smart power circuits, in which different portions of the circuit have at least partially very different potentials, for instance ground potential and 600V, isolation structures may be required that electrically insulate different portions of the circuit from each other. In this case, frequently a trench isolation is used, in particular in technologies in which SOI wafers including thick, e.g., at least 50 µm thick active silicon layers are used.

In U.S. Pat. No. 5,314,841 fabrication of a carrier wafer contact is described, wherein a trench is etched through the active wafer and the buried oxide. The exposed area in the carrier wafer is doped during the source/drain implantation and is then connected by the conventional metallization.

A similar structure is described in the patent document U.S. Pat. No. 5,945,512. The thin active silicon and the buried oxide (referred to as insulation layer) are etched through and are connected during the standard IC metallization.

A similar strategy is in U.S. Pat. No. 6,300,666. Also in this case the thin active silicon and the buried oxide are etched through and the exposed region in the carrier wafer is doped by an implantation. By means of the standard IC metallization the carrier wafer is electrically connected by the standard silicidation/metallization.

Similarly, in U.S. Pat. No. 6,794,716 a method and a structure are described, wherein a trench extending below the buried oxide is filled with "metal" and tungsten and thus electrically connects a contact region in the carrier wafer to a part of the active layer ("body" of a transistor).

A disadvantage of these approaches resides in the fact that these approaches may only be applied in combination with very shallow isolation trenches as "shallow trench isolation" in thin film SOI techniques. For depth to width ratios of 10 to 1 and higher the contacting of the carrier wafer may not be realised in this manner. A disadvantage of the structures and methods described so far is also the metallization in the trench, since in this case further high temperature processes above 400° C. are no longer possible. The essential point is, however, that the concurrent fabrication of a trench isolation and a contact to the carrier wafer is not possible on the basis of these structures and methods.

In U.S. Pat. No. 6,521,947 a method is used that is in principle similar to the above-described techniques. Here, polysilicon is used as a contact material instead of metal.

In U.S. Pat. No. 6,649,964 the following method is described. In an SOI wafer trenches of different width are etched. In this case the trenches are deeper than the buried oxide and "pierce" the same in a certain sense. Thereafter, a semiconductor layer, e.g., polysilicon or amorphous silicon, is deposited and doped by a tilted implantation. Using an anisotropic etch process a so-called spacer is created from doped silicon at the trench sidewall, wherein the spacer extends from the surface of the SOI wafer to carrier wafer. Subsequently, in some trenches a metallization is inserted and patterned, that is, in addition to the patterning of the trenches at least one further photomask is required. By means of the deposition of silicon dioxide the trenches are filled and the wafer is planarized by CMP processes (chemical mechanical polishing).

The method has the following disadvantages: at least two patterning steps are required. Due to the metallization that has already been performed any high temperature processes may not be performed during the further processing.

The carrier wafer is permanently electrically connected to the active wafer by means of the doped spacer. A contact regime that is insulated from the active silicon wafer is thus possible. In the described structure any region of the active layer is connected to the carrier wafer and is thus short circuited.

In U.S. Pat. No. 6,521,947 structures and a method, respectively, are described, wherein initially shallow isolation trenches ("shallow trench isolation") are etched. As a result thereof silicon islands covered by nitride are created. Thereafter an oxide layer is deposited. In regions remote to the silicon islands a trench is formed by a sole oxide etch process, wherein the trench extends through the deposited oxide layer and through the buried oxide of the SOI wafer. The trench extending through the oxide and terminating on the substrate is subsequently filled with polysilicon. In this way a structure is created that includes isolation trenches and contacts to the carrier wafer. This structure, however, has the disadvantage that for its creation a method has to be used that requires two different patterning processes and two different etch processes in order to form the isolation trench and the contact. On the one side, this means increased effort, and on the other side, this means that this structure in the present form may not be used for deep isolation trenches having a typical depth of 50 µm.

It is an object of the present invention to provide a method that enables the creation of structures that provide a trench isolation and a carrier wafer contact regime of SOI wafers having thick (greater than or equal to 50 µm) active layers and that may be manufactured in a significantly more efficient manner on the basis of a reduced number of process steps.

The object is solved by a manufacturing method and a circuit according to any of claims 1 and 16 of claim 11.

According to the present invention a method for manufacturing trench structures is provided, which may be used as a trench isolation and a carrier wafer contact structure for active silicon layers having a thickness of substantially 50 µm or greater in SOI wafers including high-voltage devices, wherein the trench structures may be formed by the same process steps, i.e., low effort is required.

The invention has the advantages that an isolation trench for providing insulation against high voltages is created together with a conductive contact trench connected to the carrier wafer by the same process steps. Due to the common formation of dielectric trench isolation and an electric contact for the carrier wafer of the SOI assembly the number of process steps is reduced and hence a positive effect on the reliability and yield of circuits is increased, thereby additionally saving on production costs.

Starting point for the contact having a conductive fill layer and created from the trench is a trench of increased width. Starting point of the insulating trench filled with a dielectric fill layer is a trench of reduced width, wherein the trenches of increased and reduced widths are adjacent to each other. These trenches are first formed in the active layer by an etch step, wherein a masking layer determines where the trenches are to extend to the buried insulating layer of the SOI wafer. The width of the trenches is different. The width of the wider trench is up to three times the width of the narrower trench (claim 17), wherein the wide trench at least 50% wider than the narrower trench. These trenches provided in a raw state are subsequently further treated or processed. An insulating layer is formed for both trenches, which is at least located at the sidewall of the trenches, which may, however, also be provided at the bottom where this insulating layer is above the buried oxide layer.

Thereafter, the trench of reduced width is filled and the trench of increased width is not completely filled; instead this trench is covered by the insulating layer of the first fill material at the sidewalls only. Naturally, the complete filling of the narrower trench will result in the coverage of the bottom and also in the coverage of the bottom of the wider trench.

High voltage blocking devices are not explicitly illustrated but may be formed in the active substrate prior to or after the manufacturing steps described herein, wherein this processed substrate including the two differently operational trenches has the characteristic to accommodate such—high voltage blocking—semiconductor devices according to appropriate semiconductor technologies.

Preferably, the insulating first layer that completely fills the narrow trench is polysilicon. Preferably, the masking layer has a thickness that is greater (thicker) than the thickness of the buried oxide layer.

It may be appreciated that in an etch step which extends into the trench also the layers located on the surface are subjected to such a reduction in material thickness, as is the case for instance for the first fill layer filling the narrow trench, wherein this first layer is afterwards thinned in the wider trench that is not completely filled by this first layer. In this manner also the surface of this layer is reduced in layer thickness at areas outside the trench. A removal of the insulating bottom layer of the wider trench, which involves the buried oxide layer as well as the initially formed trench isolation layer with its bottom portions, also leads to a reduction of the insulation layer at the surface. This portion is thicker—as described above—so that a portion of this insulation remains even if the insulation layers at the bottom of the wider trench are completely removed. In this way space and a transition area for a conductive fill layer is obtained, which may be incorporated between the insulating spacers so as to establish a conductive contact layer in the remaining gap in the wider trench.

In this manner two different operational trenches are provided, the narrower trench is insulating, the wider trench is conductive. Both trenches are located closely next to each other and formed in a common process including the claimed process steps that will be described in more detail later on.

If desired a planarization of the surface may additionally be performed in such a manner that all the layers extending orthogonally into the trench terminate at this planar surface, wherein the wider trench comprises more layers arranged in parallel and oriented in the vertical direction compared to the narrower trench.

Advantageous embodiments of the present invention are defined in the dependent claims and in the following detailed description.

Further embodiments will be discussed by referring to the drawings, in which:

FIG. 1 is a schematic cross-sectional view of an isolation trench in an SOI layer structure according to conventional techniques.

FIG. 2 to

Figure 9:
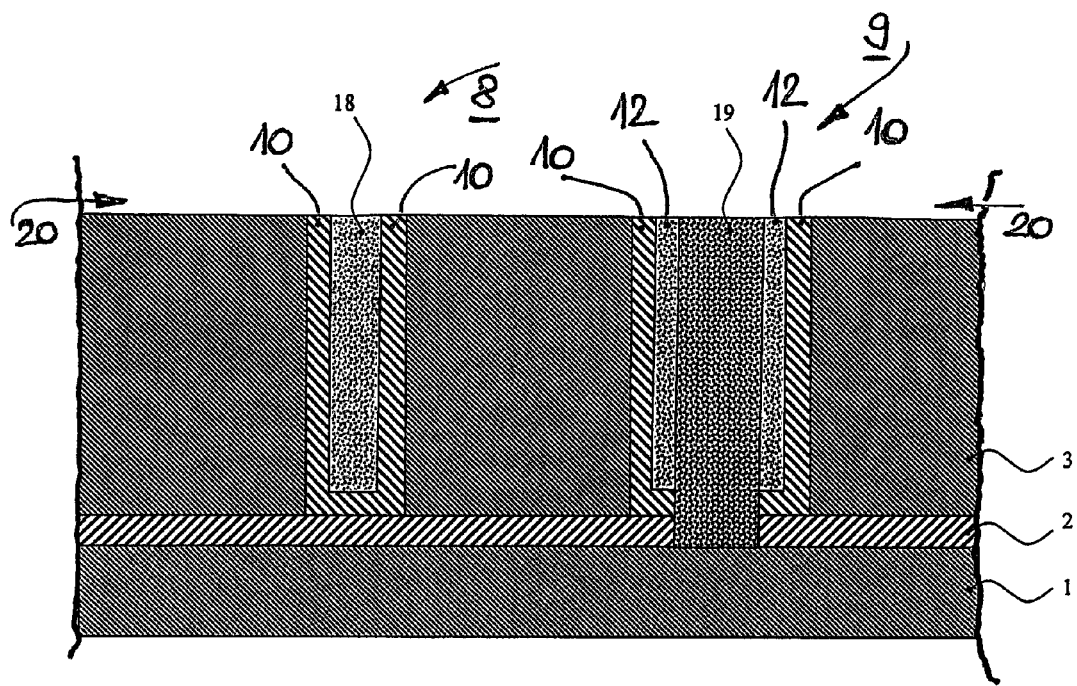

FIG. 9 schematically illustrate respective cross-sectional views of manufacturing steps for several embodiments of the present invention for obtaining the double trench structure in an SOI layer structure.

Starting point in FIG. 1 is an SOI wafer in which the carrier wafer 1 is electrically insulated to the active silicon layer 3 by a buried oxide 2. The isolation trench 6 is comprised of an insulating layer 4, such as silicon dioxide formed on the sidewalls of the trench, and a fill layer 5 that may be made of, for instance, polysilicon.

Figure 2:
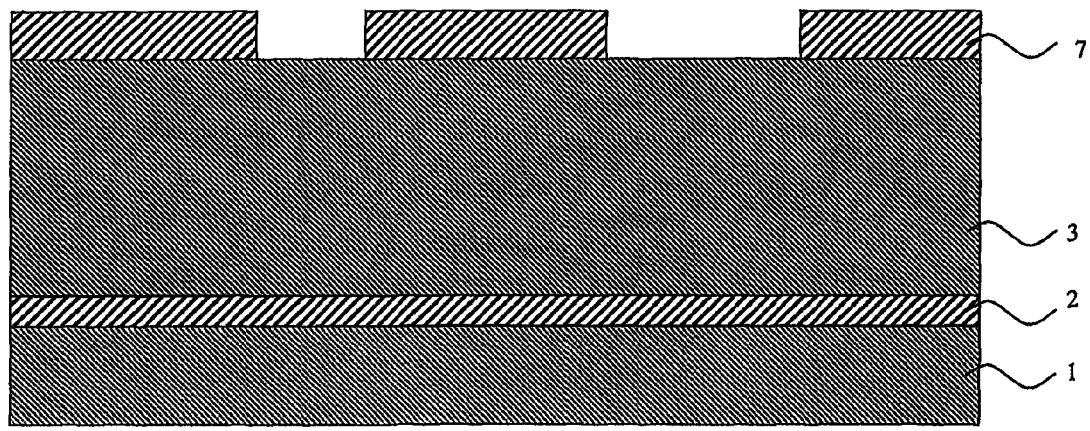

In one embodiment the starting point is also an SOI wafer consisting of the carrier wafer 1, the buried insulator 2 and the active silicon layer or wafer 3 and a masking layer 7 is formed and patterned on the active silicon layer 3, wherein in one embodiment the masking layer is comprised of silicon dioxide, while in other embodiments also different materials may be appropriate, such as silicon nitride, cf. FIG. 2.

In the embodiment shown the masking layer 7 is provided as an oxide layer and thus the layer may also be referred to as a mask oxide layer 7 having a thickness that is greater than a thickness of the layer 2 provided as a buried oxide.

Figure 3:
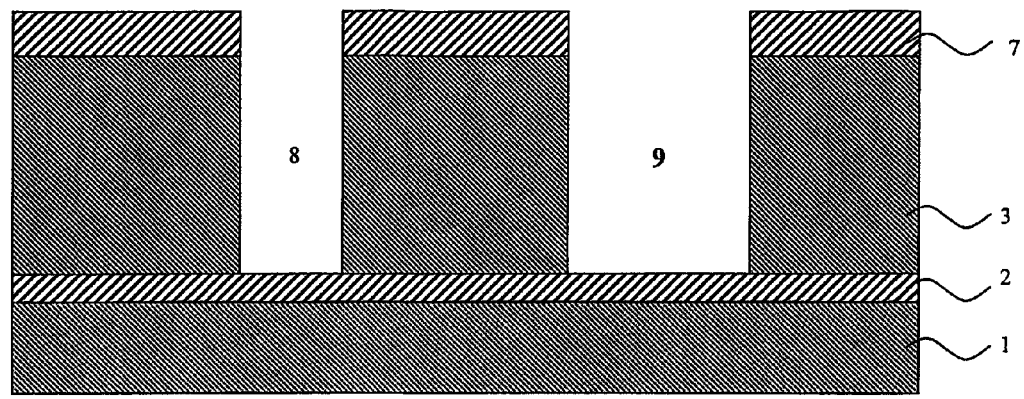

When using, for example, silicon nitride the masking layer 7 may be formed with a reduced thickness. Using the masking layer 7 trenches 8 and 9 of different width may etch down to the buried oxide layer 2, as shown in FIG. 3.

Thereafter, a trench insulation layer 10 is applied (in a depositing manner) or is (thermally) formed.

Figure 4:
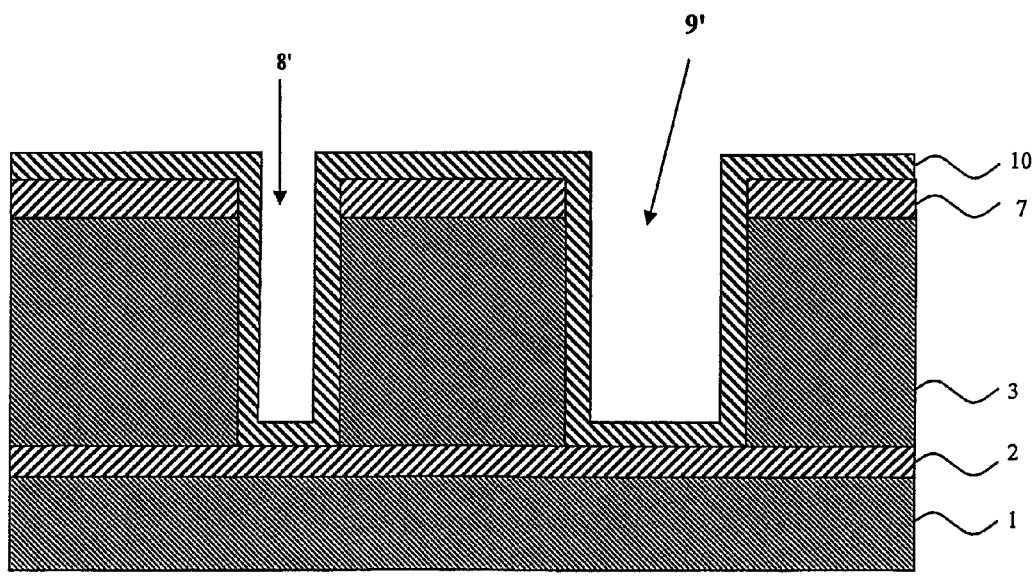

In a first embodiment according to FIG. 4 this trench insulation layer 10 is a CVD layer. A remaining trench 9' or 8' is less wide than the initial trench 9 or 8. In other embodiments a trench insulation layer 10' (not shown but readily appreciable for the skilled person) is formed in a substantially selective manner at the trench sidewalls by a thermal oxidation.

Figure 5:
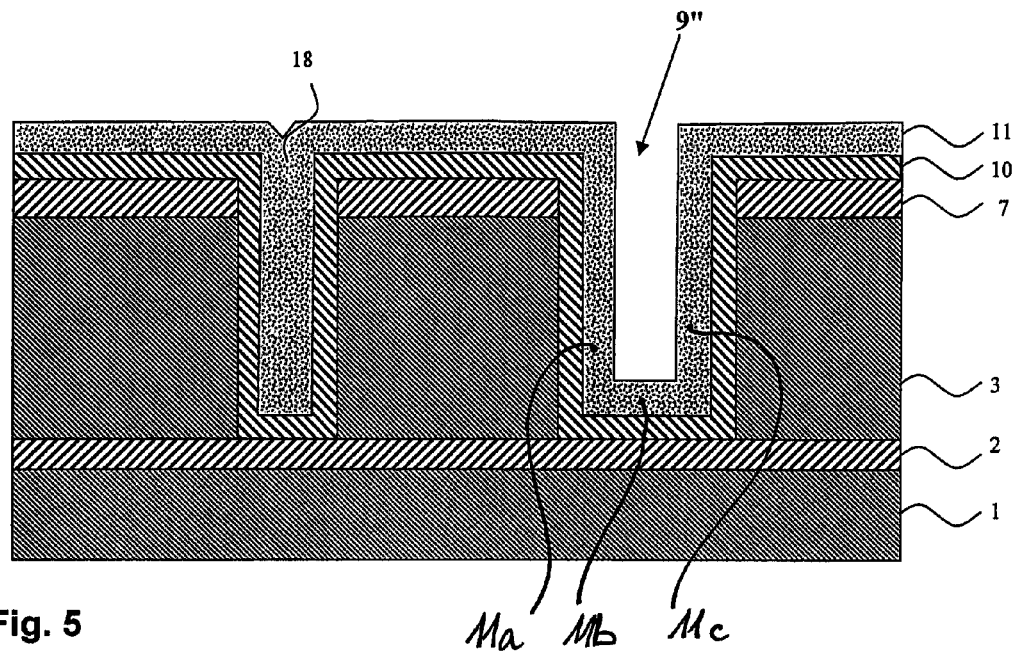

By depositing a fill material, for instance, in the form of a polysilicon layer 11, the narrow trench 8' is filled with a fill layer 18, while in the wide trench 9' only the opposing trench sidewalls are covered, thereby not completely filling this trench, as shown in FIG. 5. An open trench 9" having a further reduced width remains, which in the first embodiment is bordered at its side faces and the bottom by the deposited layer sections 11a, 11b and 11c of the layer 11.

Figure 6:
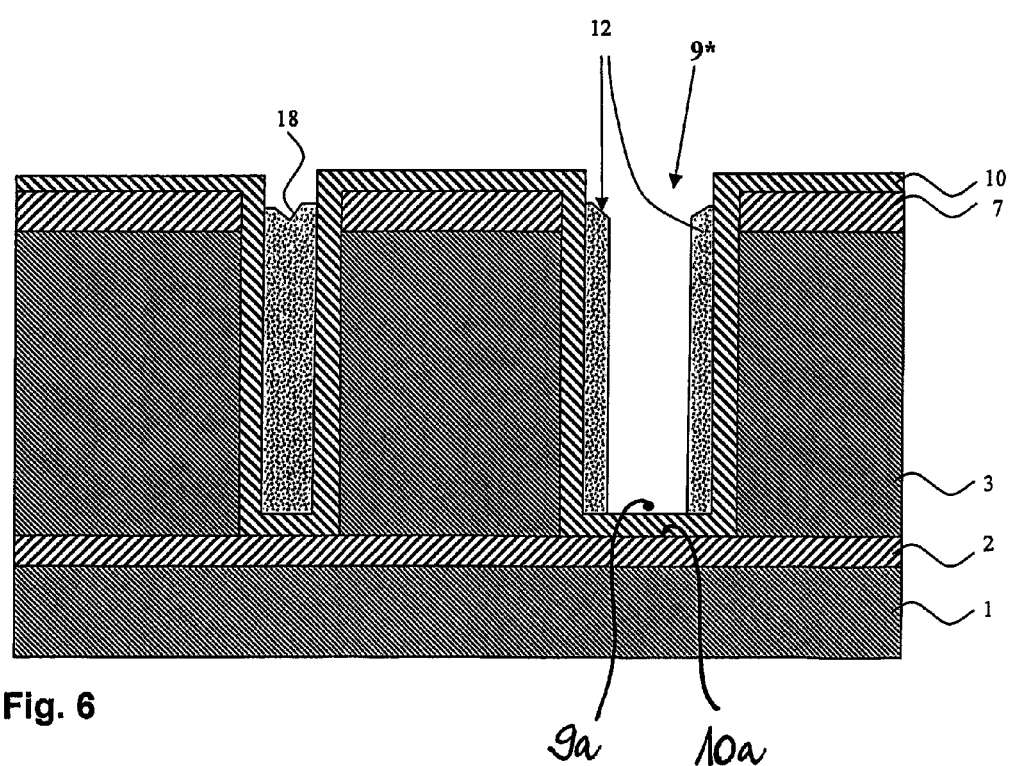

FIG. 6 illustrates the structure after a polysilicon etch step. The polysilicon 11 is removed at the surface and the trench bottom 9a in the wider trench 9" so that the trench insulation layer 10 is exposed with its bottom portion 10a of formed by a CVD.

For a trench insulation layer 10' formed selectively at sidewalls, by for instance oxidation, the buried layer 2 may be exposed by this etch step.

The narrow trench 8 still remains filled with polysilicon. In the trench 9\* that now has increased in width a polysilicon spacer 12 remains at each sidewall.

Figure 7:
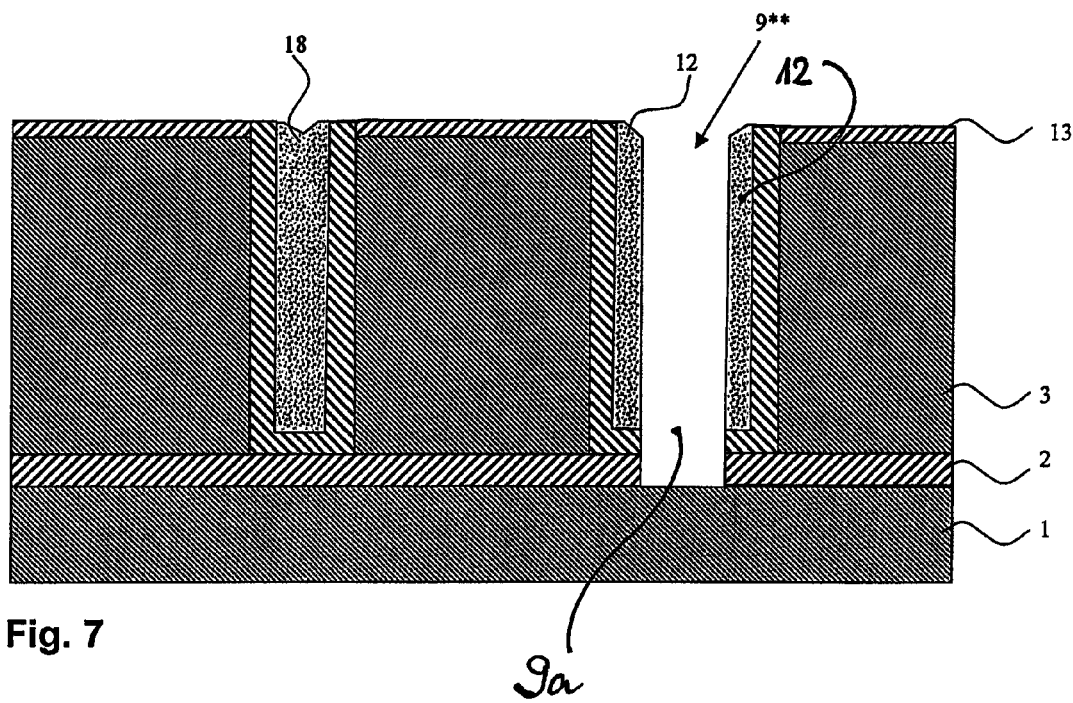

By adjusting (in a specifically tailored manner) the polysilicon etch process the polysilicon spacer 12 obtains a target height. FIG. 7 illustrates the structure after an oxide etch process that is preferably performed by a plasma based etch process, in which the buried oxide 2 at the bottom 9a of the trench **9\*\* having again increased in width and the layer 10a (as a portion of the layer 10) are completely etched at the bottom. In the other (thermal) embodiment the layer portion 10a is substantially not provided at the trench bottom and hence it is substantially etched through the buried layer 2** only.

In this case in the embodiment shown also a portion of the oxide at the surface may be removed. Since the masking layer 7, if formed of oxide, has a greater thickness compared to the buried oxide layer 2 a residual oxide layer 13 remains at the surface.

If the masking layer 7 comprises silicon nitride the oxide of the buried layer 2 and, if formed there, the oxide of the layer portion 10a may be removed selectively to the silicon nitride of the masking layer 7 while a thickness of the masking layer is not a critical factor.

The narrower isolation trench 8 having the insulating fill material 18, shown at the left hand side of FIG. 7, remains completely filled.

Figure 8:
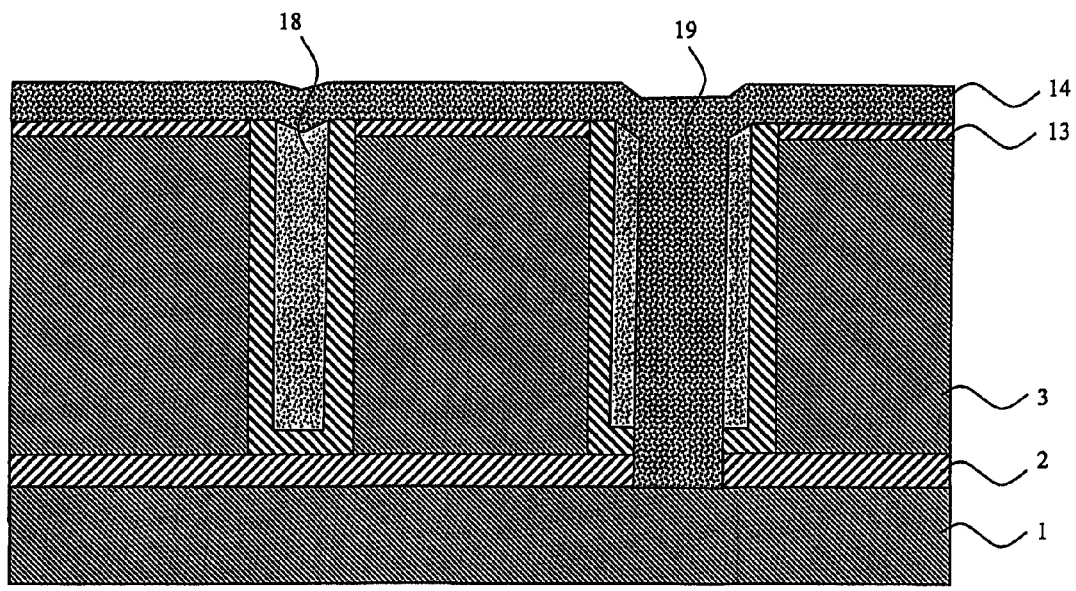

Subsequently, also the wider trench 9 having the width **9\*\* in this state may be filled with a conductive fill material 19 by depositing a second fill layer 14 having an appropriate conductivity, cf. FIG. 8. The surface 20 may preferably be planarized by CMP (chemical mechanical polishing), cf. FIG. 9**.

All vertical layers in the two trenches 9, 8 extend to the planarized surface.

Devices, such as semiconductors having a high blocking voltage, such as MOSFET having a blocking voltage of more than 300 V, may be formed on or in the active layer; appropriate techniques for this purpose are well-known in the art.

By means of the electrically conductive second fill layer 19 the carrier wafer 1 may be electrically contacted from the surface. An insulating trench 8 is provided adjacent thereto. The substrate has no longer a floating potential.

REFERENCE SIGNS

1: carrier wafer of the SOI wafer, "handle wafer"
2: buried insulating layer, e.g., $SiO_2$ as a "buried oxide"
3: active silicon layer "device wafer"
4: insulating layer, for example, $SiO_2$
5: fill layer, for example, polysilicon
6: insulation trench ("trench")
7: masking layer formed of $SiO_2$
8: insulation trench with reduced width
8': insulation trench during processing
9: trench with increased width 9', 9", 9\*, **9\*\***:
 trench 9 during processing
9a: trench bottom
10a: insulation portion at the trench bottom
10: insulation oxide
11: first fill layer (insulating)
12: etched fill layer 11 in the form of a spacer 12 in the wider trench
13: etched masking layer 7, e.g. oxide
14: second conductive fill layer
18: filling of the narrower isolation trench 8
19: filling of the wider trench 9
20: planarized surface

I claim:

1. A method of forming an electrical carrier wafer contact together with an isolation trench in an SOI wafer for integrated circuits, the method comprising the following steps:

forming with a masking layer a first trench having a first width for the isolation trench and forming a second trench for a carrier wafer contact, said second trench having a second width being greater than said first width, wherein said first and second trenches extend to a buried insulating layer;

forming an insulating layer on each sidewalls of the first and second trenches;

filling a first fill material into said first and second trenches, whereby said first trench is filled and said first fill material only covers the sidewalls and a trench bottom of said second trench having said greater width;

etching said first fill material until said fill material is removed from the trench bottom of said second trench thereby forming lateral spacers in said second trench, said spacers being comprised of said first fill material;

further etching to downwards extend said second trench to reach down to the carrier wafer;

depositing a second conductive fill material to fill said downwards extended second trench, the steps commonly performed for said electrical carrier wafer contact and said isolation trench.

2. The method of claim 1, wherein forming an insulating layer at least on each sidewalls of the first and second trenches comprises depositing an insulating material.

3. The method of claim 1, wherein forming an insulating layer at least on each sidewalls of the first and second trenches comprises forming an insulating layer by oxidation.

4. The method of claim 1, wherein said masking layer is comprised of silicon dioxide and has a first thickness that is greater than a second thickness of said buried insulating layer.

5. The method of claim 1, wherein said masking layer is comprised of silicon nitride.

6. The method of claim 1, wherein said first fill material comprises polysilicon.

7. The method of claim 1, wherein a depth of the first and second trenches is greater than approximately 50 μm.

8. The method of claim 1, wherein etching to the carrier wafer is performed by a plasma etch process.

9. The method of claim 6, wherein the polysilicon is at least substantially electrically non-conductive.

10. A method for forming an electrical carrier wafer contact together with the formation of an isolation trench in an SOI wafer for integrated circuits including high-voltage devices, wherein at the beginning of the method that is commonly applied to said electrical carrier wafer contact and said isolation trench, two trenches of different widths are etched to a buried insulating layer using a masking layer comprised of $SiO_2$ and having a thickness greater than a thickness of a buried insulating layer, wherein a narrower trench of the said two trenches is provided for the isolation trench and a wider trench is provided for the electrical carrier wafer contact;

thereafter a trench insulation layer is deposited or formed by an oxidation and subsequently a polysilicon layer is deposited such that the narrower trench is completely filled with said polysilicon layer while in the wider trench only lateral sidewalls and a bottom are covered, and thereafter the polysilicon is removed from above a surface of said masking layer, outside of said two trenches and from the trench bottom by a polysilicon etch process, such that a polysilicon spacer is maintained on each lateral sidewall in the wider trench and a target height of said spacers is obtained by an adjustment of the polysilicon etch process;

wherein at least the buried insulating layer at the bottom of the wider trench is etched away so as to remove a portion of the trench insulation layer from above the surface of said masking layer, thereby maintaining a residual oxide layer at the surface of said masking layer, and wherein subsequently also the wider isolation trench is filled by depositing a conductive fill layer and the thereafter the surface is planarized.

11. The method of claim 10, wherein a depth of the trenches is greater than or equal to 50 µm.

12. The method of claim 10, wherein the buried insulating layer is etched away at the bottom of the wider trench by a plasma-chemical etch process.

13. The method of claim 10, wherein the polysilicon layer is electrically non-conductive.

14. The method of claim 10, wherein the conductive fill layer is composed of electrically conductive and electrically non-conductive layer portions.

15. An integrated circuit comprising at least one blocking device on an SOI wafer, comprising two different types of trenches formed by the same process steps and having different widths, wherein a narrower trench forms an isolation trench and a wider trench forms a carrier wafer contact and walls of both trenches are covered by an insulating layer having the same thickness and the same type of configuration in both trenches, wherein said isolation trench is completely filled with non-conductive polysilicon and the same polysilicon is provided in a thinned state as an intermediate layer on sidewalls of the carrier wafer contact trench;

the insulating layers in both trenches terminate in a depth direction on a buried insulating layer of said SOI wafer;

the wider trench is filled with an electrically conductive polysilicon layer that extends through the buried insulating layer and contacts a carrier wafer;

wherein all layers provided within the trenches terminate on a planar surface.

16. The integrated circuit of claim 15, wherein a ratio of the width of the narrow trench to the width of the wide trench is between 1 to 1.5 and 1 to 3.

17. The integrated circuit of claim 15, wherein the depth of the trenches is equal to or greater than 50 µm.

18. The integrated circuit of claim 15, wherein the electrically conductive polysilicon layer is comprised of electrically conductive and electrically non-conductive layer portions.

* * * * *

UNITED STATES PATENT AND TRADEMARK OFFICE
CERTIFICATE OF CORRECTION

| | | |
|---|---|---|
| PATENT NO. | : 8,053,897 B2 | Page 1 of 1 |
| APPLICATION NO. | : 11/908269 | |
| DATED | : November 8, 2011 | |
| INVENTOR(S) | : Ralf Lerner | |

It is certified that error appears in the above-identified patent and that said Letters Patent is hereby corrected as shown below:

Col. 6, claim 1, line 10, should read "sidewall" instead of "sidewalls"

Signed and Sealed this
Seventeenth Day of July, 2012

David J. Kappos
*Director of the United States Patent and Trademark Office*